(12) United States Patent
Onishi

(10) Patent No.: US 10,348,081 B2
(45) Date of Patent: Jul. 9, 2019

(54) CURRENT BREAKER

(71) Applicant: TOYOTA JIDOSHA KABUSHIKI KAISHA, Toyota-shi, Aichi-ken (JP)

(72) Inventor: Yukio Onishi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 263 days.

(21) Appl. No.: 15/503,739

(22) PCT Filed: Jun. 23, 2015

(86) PCT No.: PCT/JP2015/068093
§ 371 (c)(1),
(2) Date: Feb. 14, 2017

(87) PCT Pub. No.: WO2016/027563
PCT Pub. Date: Feb. 25, 2016

(65) Prior Publication Data
US 2017/0279262 A1 Sep. 28, 2017

(30) Foreign Application Priority Data
Aug. 22, 2014 (JP) ................................. 2014-169471

(51) Int. Cl.
*H02H 3/08* (2006.01)
*H01L 23/50* (2006.01)
(Continued)

(52) U.S. Cl.
CPC ............... *H02H 3/08* (2013.01); *H01L 23/50* (2013.01); *H01L 24/48* (2013.01); *H01L 27/0288* (2013.01); *H01L 28/20* (2013.01); *H01L 29/7395* (2013.01); *H01L 27/0629* (2013.01); *H01L 2224/0603* (2013.01);
(Continued)

(58) Field of Classification Search
CPC .................................. H02H 3/08; H01L 23/50
See application file for complete search history.

(56) References Cited

U.S. PATENT DOCUMENTS 4,270,137 A * 5/1981 Coe ........................ H01L 29/405
257/336
2005/0213275 A1 9/2005 Kitagawa
(Continued)

FOREIGN PATENT DOCUMENTS

JP 2007-250347 A 9/2007
JP 2010-199149 A 9/2010
(Continued)

*Primary Examiner* — Scott Bauer
(74) *Attorney, Agent, or Firm* — Oliff PLC

(57) ABSTRACT

A current breaker includes a semiconductor substrate in which a switching element is provided, a first electrode provided on a surface of the semiconductor substrate, a second electrode provided on the surface and separated from the first electrode, a resistive film provided on the surface and connecting the first electrode and the second electrode, a terminal, a bonding wire connecting the first electrode and the terminal, and a control element configured to turn on the switching element when a voltage between both ends of a current path including the resistive film exceeds a threshold value. The switching element is connected to at least one of the first electrode and the second electrode.

4 Claims, 8 Drawing Sheets

(51) Int. Cl.
*H01L 23/00* (2006.01)
*H01L 49/02* (2006.01)
*H01L 29/739* (2006.01)
*H01L 27/02* (2006.01)
*H01L 27/06* (2006.01)

(52) U.S. Cl.
CPC ............... *H01L 2224/32245* (2013.01); *H01L 2224/48245* (2013.01); *H01L 2224/48247* (2013.01); *H01L 2224/48472* (2013.01); *H01L 2224/73265* (2013.01)

(56) References Cited

U.S. PATENT DOCUMENTS

| | | |
|---|---|---|
| 2009/0085521 A1 | 4/2009 | Kim |
| 2011/0304327 A1* | 12/2011 | Ausserlechner ..... G01R 15/207 324/239 |
| 2012/0013182 A1 | 1/2012 | Minegishi et al. |
| 2012/0175687 A1* | 7/2012 | Dibra ..................... G01K 1/08 257/252 |
| 2013/0265015 A1* | 10/2013 | Chang ............... H01L 23/49503 323/222 |

FOREIGN PATENT DOCUMENTS

| | | |
|---|---|---|
| KR | 2006-0043676 A | 5/2006 |
| KR | 2009-0032611 A | 4/2009 |
| WO | 2010122648 A1 | 10/2010 |

\* cited by examiner

CURRENT BREAKER

TECHNICAL FIELD

This application is related to and claims priority to Japanese Patent Application No. 2014-169471 filed on Aug. 22, 2014, the entire contents of which are hereby incorporated by reference into the present application.

The technique disclosed herein relates to a current breaker.

BACKGROUND ART

Japanese Patent Application Publication No. 2007-250347 discloses a current breaker that uses a bonding wire (which may hereinbelow be denoted as BW) as a replacement of a fuse. When an overcurrent flows in a BW, the BW is fused and cut. Due to this, a current is prevented from flowing further in a protection target.

SUMMARY OF INVENTION

Technical Problem

The description herein provides a current breaker that uses a BW and can more surely protect its protection target.

Solution to Problem

The inventors of the present application created a current breaker that uses a switching element and a BW. This current breaker includes a semiconductor substrate, an electrode provided on a surface of the semiconductor substrate, and a BW connected to the electrode. A switching element connected to the electrode on the surface is provided in the semiconductor substrate. Upon using this current breaker, a protection target element or a protection target circuit is connected to the electrode on the surface. The current breaker is used so that a current flows through the protection target and the BW. In this current breaker, a voltage between both ends of the BW is detected. The voltage between the both ends of the BW has some degree of correlation with the current flowing through the BW (that is, the current flowing through the protection target). In this current breaker, the switching element turns on when the detected voltage exceeds a threshold. When this happens, the current starts to flow through the BW via the switching element, as a result of which the current flowing through the BW increases. Due to this, the BW breaks and an overcurrent is prevented from flowing in the protection target.

This current breaker uses the fact that the voltage between both ends of the BW is correlated with the current flowing through the BW. Since the BW has a resistance, the voltage between both ends of the BW correlates, by some degree, with the current flowing through the BW. However, the BW also has an inductance. Due to this, a voltage generated by the inductance of the BW (that is, a value obtained by multiplying a change rate of the current flowing through the BW by the inductance) is also generated between both ends of the BW. Due to this, the voltage between both ends of the BW does not have much high correlation to the current flowing through the BW (that is, the current flowing through the protection target). Thus, in the current breaker mentioned as above, the current cannot be interrupted in precise correspondence with the current flowing in the protection target. If the BW is lengthened to increase the resistance of the BW, the inductance of the BW also increases, and thus this method cannot provide a solution to this problem. Thus, the description disclosed herein provides an improved current breaker that uses a switching element and a BW.

A current breaker disclosed herein comprises a semiconductor substrate in which a switching element is provided, a first electrode provided on a surface of the semiconductor substrate, a second electrode provided on the surface and separated from the first electrode, a resistive film provided on the surface and connecting the first electrode and the second electrode, a terminal, a bonding wire connecting the first electrode and the terminal, and a control element configured to turn on the switching element when a voltage between both ends of a current path including the resistive film exceeds a threshold value. The switching element is connected to at least one of the first electrode and the second electrode.

Notably, "a current path including the resistive film" may be any current path so long as it includes the resistive film. Thus, "a voltage between both ends of a current path including the resistive film" may be a voltage between the first and second electrodes, may be a voltage between the terminal and the second electrode, or may be a voltage between the terminal and another terminal connected to the second electrode.

This current breaker comprises the resistive film independent of the BW. The resistive film can be given a high resistance compared to the BW. Thus, the voltage between both ends of the current path including the resistive film has a high correlation with the current flowing through the resistive film (that is, the current flowing through a protection target element or a protection target circuit). Due to this, the protection target can more surely be protected by controlling the switching element based on the voltage between both ends of the current path including the resistive film.

DESCRIPTION OF EMBODIMENTS

Figure 1:
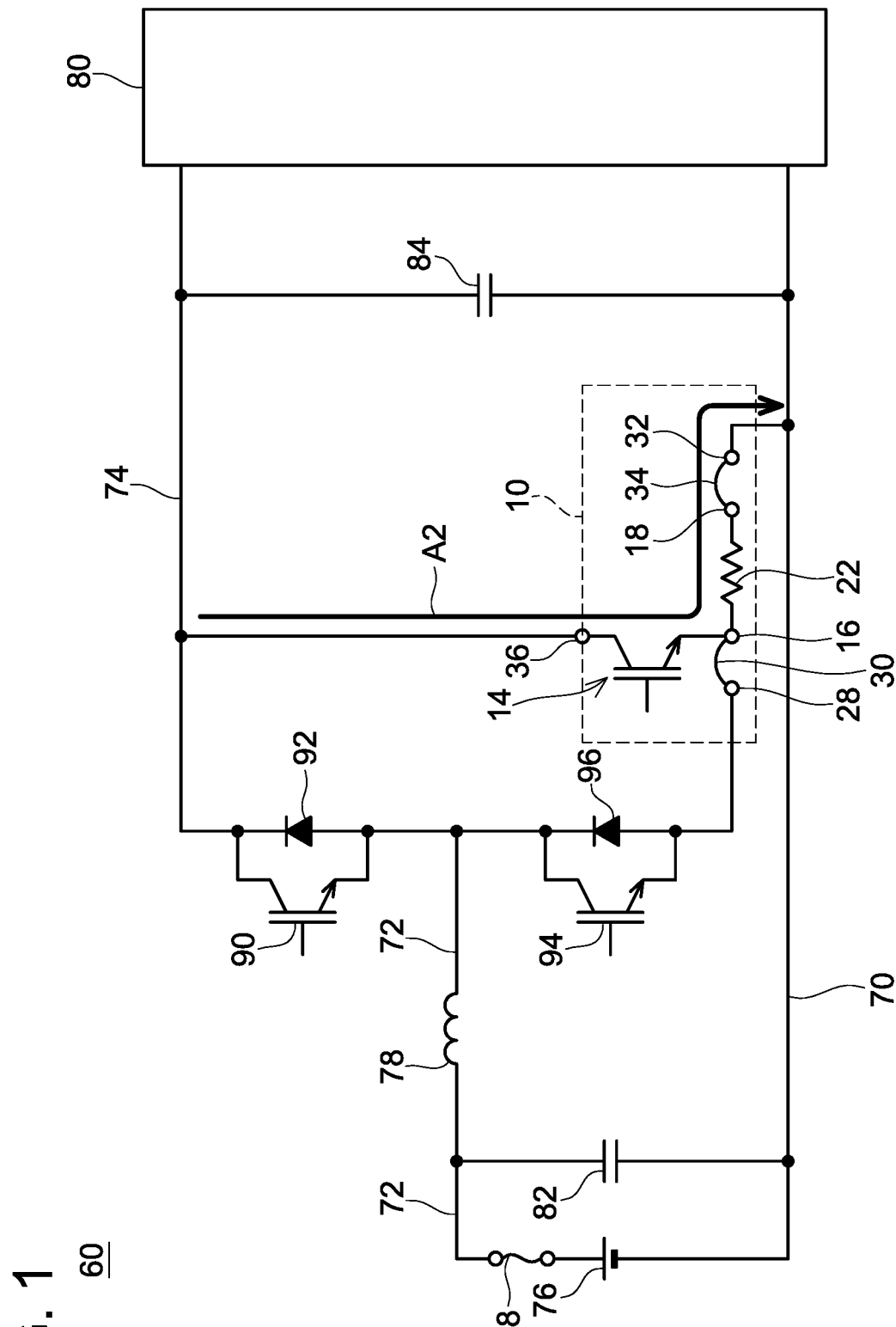
FIG. 1 is a circuit diagram of a DC-DC converter circuit 60.

FIG. 1 SHOWS a DC-DC converter circuit 60 comprising a current breaker 10 of an embodiment. The DC-DC converter circuit 60 boosts a voltage applied by a battery 76, and supplies the boosted voltage to an inverter circuit 80. The DC-DC converter circuit 60 and the inverter circuit 80 are mounted in a hybrid vehicle. The inverter circuit 80 supplies power to a motor of the hybrid vehicle.

The battery 76 is connected between an input wiring 72 and a low potential wiring 70. A positive side of the battery 76 is connected to the input wiring 72 via a fuse 68. A negative side of the battery 76 is connected to the low potential wiring 70. A coil 78 is interposed in the input wiring 72. A capacitor 82 is connected between the input wiring 72 and the low potential wiring 70. The capacitor 82 is connected to the input wiring 72 on a fuse 68 side relative to the coil 78. An IGBT 94 and a diode 96 are connected in parallel to the input wiring 72 on an opposite side to the fuse 68 with the coil 78 intervened in between. A cathode of the diode 96 and a collector of the IGBT 94 are connected to the input wiring 72. A gate control circuit, which is not shown, is connected to a gate of the IGBT 94. An anode of the diode 96 and an emitter of the IGBT 94 are connected to the current breaker 10. The anode of the diode 96 and the emitter of the IGBT 94 are connected to the low potential wiring 70 via the current breaker 10. An IGBT 90 and a diode 92 are connected in parallel between the input wiring 72 on the opposite side to the fuse 68 with the coil 78 intervened in between and an output wiring 74. A cathode of the diode 92 is connected to the output wiring 74, and an anode of the diode 92 is connected to the input wiring 72. Further, a collector of the IGBT 90 is connected to the output wiring 74 and an emitter of the IGBT 90 is connected to the input wiring 72. A gate control circuit, which is not shown, is connected to a gate of the IGBT 90. A capacitor 84 is connected between the output wiring 74 and the low potential wiring 70. The output wiring 74 and the low potential wiring 70 are connected to the inverter circuit 80.

Figure 2:
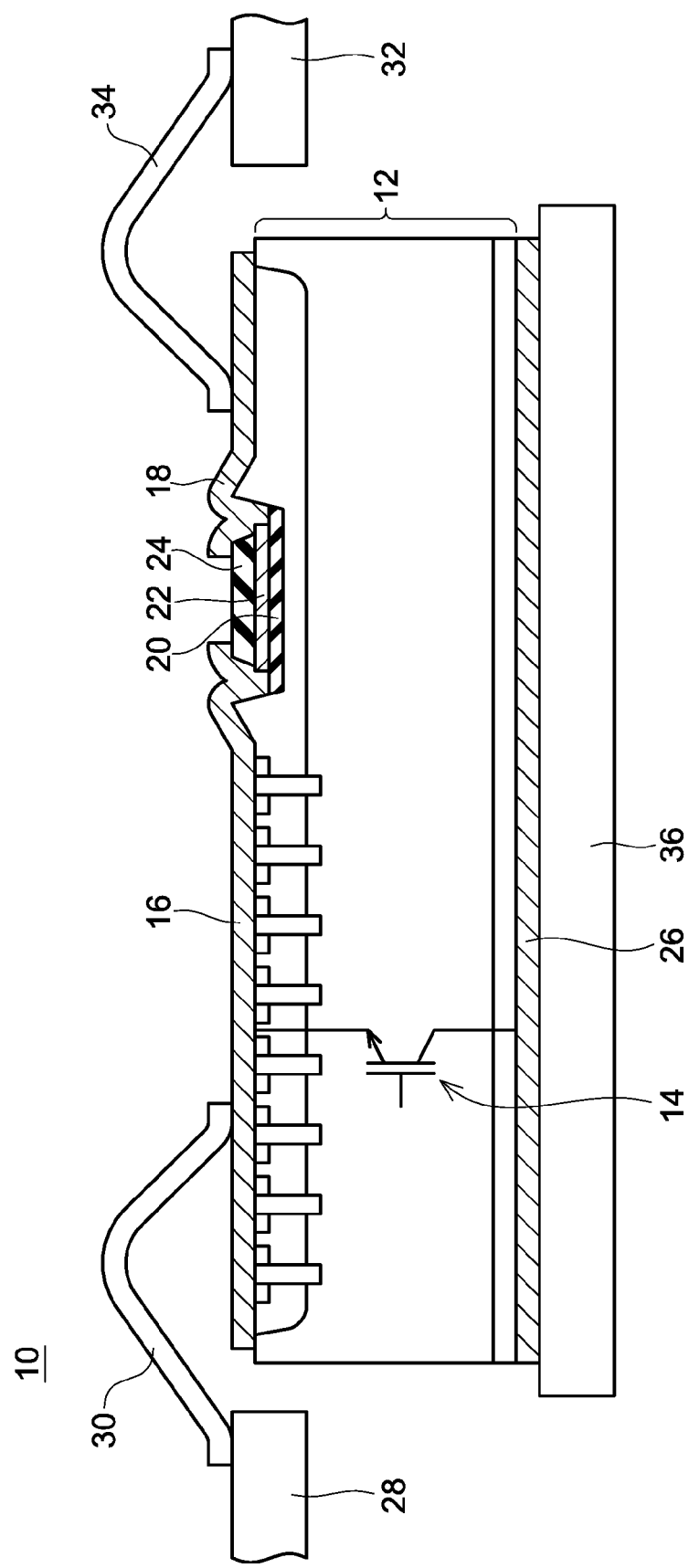
FIG. 2 is a vertical cross sectional view of a current breaker 10.

As shown in FIG. 2, the current breaker 10 comprises a semiconductor substrate 12. A IGBT 14 is provided in the semiconductor substrate 12. An electrode 16, an electrode 18, an insulating film 20, a resistive film 22, and an insulating film 24 are provided on an upper surface of the semiconductor substrate 12. The electrode 16 is provided on the upper surface of the semiconductor substrate 12. The electrode 16 is an emitter electrode of the IGBT 14. The electrode 18 is provided on the upper surface of the semiconductor substrate 12. The electrode 18 is separated from the electrode 16. The insulating film 20 is provided on the upper surface of the semiconductor substrate 12 between the electrode 16 and the electrode 18. The resistive film 22 is provided on the insulating film 20. The resistive film 22 is constituted of impurity-doped silicon. The resistive film 22 is insulated from the semiconductor substrate 12 by the insulating film 20. The resistive film 22 is in contact with the electrode 16 and the electrode 18. That is, the resistive film 22 connects the electrode 16 and the electrode 18. The resistive film 22 has a predetermined resistance. An upper surface of the resistive film 22 is covered by the insulating film 24. A rear surface electrode 26 is provided on a lower surface of the semiconductor substrate 12. The rear surface electrode 26 is a collector electrode of the IGBT 14. Further, although not shown, a bonding pad for a gate electrode of the IGBT 14 is provided on the upper surface of the semiconductor substrate 12. This bonding pad is connected to an IC 54 to be described later.

The current breaker 10 comprises a bus bar 28, a BW 30, a bus bar 32, a BW 34, and a bus bar 36. The bus bars 28, 32, 36 are terminals. The bus bar 28 is connected to the electrode 16 by the BW 30. Further, as shown in FIG. 1, the bus bar 28 is connected to the emitter of the IGBT 94 and the anode of the diode 96. As shown in FIG. 2, the bus bar 32 is connected to the electrode 18 by the BW 34. Further, as shown in FIG. 1, the bus bar 32 is connected to the low potential wiring 70. As shown in FIG. 2, the rear surface electrode 26 (that is, the collector of the IGBT 14) is connected to the bus bar 36. As shown in FIG. 1, the bus bar 36 is connected to the output wiring 74.

Figure 3:
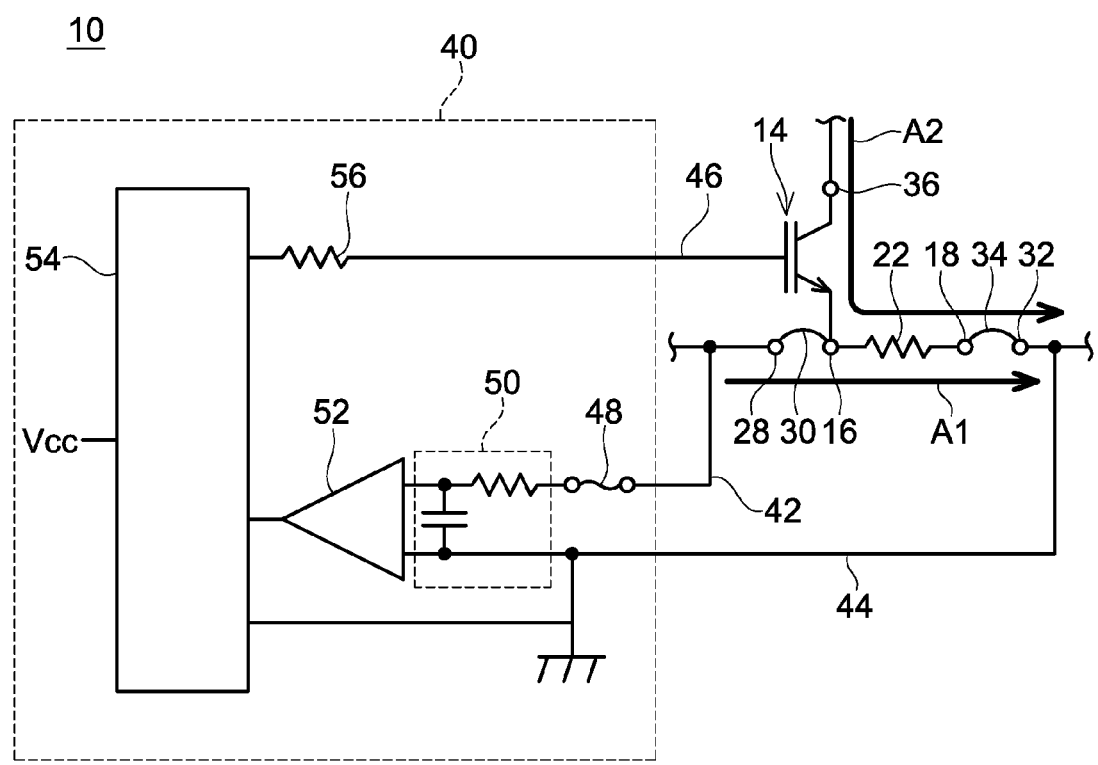
FIG. 3 is a circuit diagram of the current breaker 10.

The current breaker 10 further comprises a driving circuit 40 shown in FIG. 3. The driving circuit 40 comprises an input wiring 42 connected to the bus bar 28, an input wiring 44 connected to the bus bar 32, and a gate wiring 46 connected to a gate of the IGBT 14. The input wiring 42 is connected to a buffer circuit 52 via a fuse 48 and a filtering circuit 50. The input wiring 44 is connected to the buffer circuit 52 via the filtering circuit 50. The filtering circuit 50 is constituted of a resistance interposed in the input wiring 42, and a capacitor connected between the input wiring 42 and the input wiring 44. The filtering circuit 50 removes noise from a signal between the input wiring 42 and the input wiring 44. The signal between the input wiring 42 and the input wiring 44 from which the noise has been removed (that is, a voltage V1 between the bus bar 28 and the bus bar 32) is inputted to the buffer circuit 52. The buffer circuit 52 is connected to the IC 54. The buffer circuit 52 rectifies the inputted voltage V1 to a value suitable for a driving voltage of the IC 54, and inputs the same to the IC 54. The IC 54 is connected to the gate of the IGBT 14 via a gate resistance 56. The IC 54 controls a gate potential of the IGBT 14 according to the voltage V1 between the bus bar 28 and the bus bar 32.

Next, an operation of the DC-DC converter circuit 60 will be described. Normally, the IGBT 14 of the current breaker 10 is off. Further, the IGBTs 90, 94 are controlled such that a state in which the IGBT 90 turns on and the IGBT 94 turns off and a state in which the IGBT 94 turns on and the IGBT 90 turns off are alternately repeated. The operation of the DC-DC converter circuit 60 changes depending on a case where the motor of the hybrid vehicle is consuming energy (powering operation) and a case where the motor is generating electricity (regeneration operation).

In the powering operation, power is supplied from the battery 76 to the inverter circuit 80. In the powering operation, when the state in which the IGBT 94 turns on and the IGBT 90 turns off takes place, a current flows from the positive side of the battery 76 toward the low potential wiring 70 through the fuse 68, the coil 78, the IGBT 94, and the current breaker 10. At this occasion, in the current breaker 10, the current flows from the bus bar 28 toward the bus bar 32 through the BW 30, the electrode 16, the resistive film 22, the electrode 18, and the BW 34 along an arrow A1 shown in FIG. 3.

Thereafter, the state is switched to the state in which the IGBT 90 turns on and the IGBT 94 turns off. Then, a current flows from the positive side of the battery 76 toward the output wiring 74 through the fuse 68, the coil 78, and the diode 92. Further, the coil 78 generates induced electromotive force in a direction sustaining the current. Due to this, a voltage in which the induced electromotive force of the coil 78 is superposed on an output voltage of the battery 76 is outputted to the output wiring 74. That is, a voltage higher than the output voltage of the battery 76 is applied to the output wiring 74. Thus, in the powering operation, a high voltage is supplied to the inverter circuit 80 by repeating the on and off of the IGBTs 90, 94.

In the regeneration operation, the power is supplied from the inverter circuit 80 to the battery 76, and the battery 76 is thereby charged. In the regeneration operation, when the state in which the IGBT 90 turns on and the IGBT 94 turns off takes place, the current flows from the output wiring 74 toward the positive side of the battery 76 through the IGBT 90, the coil 78, and the fuse 68.

Thereafter, the state is switched to the state in which the IGBT 94 turns on and the IGBT 90 turns off. Then, the coil 78 generates the induced electromotive force in a direction sustaining the current. Due to this, the current flows from the low potential wiring 70 toward the positive side of the battery 76 through the current breaker 10, the diode 96, the coil 78, and the fuse 68. Thus, in the regeneration operation, the battery 76 is charged by repeating the on and off of the IGBTs 90, 94.

Next, an operation of the current breaker 10 will be described. When the current flows in the IGBT 94 as described above, the current flows through the current breaker 10 along the arrow A1 shown in FIG. 3. Due to this, when the current flowing through the IGBT 94 increases due to some reason, the current shown by the arrow A1 of FIG. 3 also increases. The IC 54 shown in FIG. 3 monitors the voltage V1 between the bus bar 28 and the bus bar 32. The IC 54 increases a gate voltage of the IGBT 14 when the voltage V1 exceeds a predetermined threshold, and turns the IGBT 14 on. In so doing, as shown by an arrow A2 of FIGS. 1 and 3, a current flows to the low potential wiring 70 from the output wiring 74 having a high potential. The current shown by the arrow A2 is an extremely large current. This current passes through the bus bar 36, the IGBT 14, the electrode 16, the resistive film 22, the electrode 18, the BW 34, and the bus bar 32. Since the current shown by the arrow A2 is extremely large, the IGBT 14 is thermally destructed when the current shown by the arrow A2 flows therethrough. Further, the BW 34 is broken by an impact generated upon the thermal destruction of the IGBT 14. That is, the BW 34 functions as a fuse. Due to this, the IGBT 94 is cut off from the low potential wiring 70, and the high current is prevented from flowing further through the IGBT 94. Due to this, the DC-DC converter circuit 60 is protected from an overcurrent.

Further, when the BW 34 is broken, the current flowing from the IGBT 94 toward the current breaker 10 flows into the input wiring 42 of the driving circuit 40 shown in FIG. 3. When this happens, the fuse 48 breaks. Due to this, the current is prevented from flowing into the IC 54, and the IC 54 is thereby protected.

As described above, the current breaker 10 can protect the DC-DC converter circuit 60. Here, the resistance of the resistive film 22 is large enough for an influence of an inductance in a current path between the bus bar 28 and the bus bar 32 (for example, inductances of the BWs 30, 34 and the like) to be barely noticeable in the voltage V1. Further, since the resistive film 22 is formed on the upper surface of the semiconductor substrate 12, it is substantially flat. Due to this, an inductance of the resistive film 22 is extremely low. Thus, the voltage V1 is substantially proportional to the current flowing through the resistive film 22. That is, a correlation of the voltage V1 and the current flowing through the resistive film 22 (that is, the current flowing through the IGBT 94) is extremely high. Due to this, the DC-DC converter circuit 60 can surely be protected by turning on the IGBT 14 based on the voltage V1. Further, by the BW 34 being broken, the overcurrent is prevented from flowing in the battery 76, and the fuse 68 can be prevented from breaking.

Notably, in the above embodiment, the IC 54 controls the IGBT 14 according to the voltage V1 between the bus bar 28 and the bus bar 32. However, a voltage measuring points may be any points so long as the points are both ends of the current path including the resistive film 22. For example, the voltage may be measured between the electrode 16 and the electrode 18. Further, the voltage may be measured between the bus bar 28 and the electrode 18. Further, the voltage may be measured between the bus bar 32 and the electrode 16. Since the resistive film 22 has a relatively high resistance, an influence on the voltage caused by the inductance of the current path can be relatively diminished by measuring the voltage in the current path including the resistive film 22. Accordingly, the voltage having a high correlation to the current flowing in the current path can be measured, and the DC-DC converter circuit 60 can surely be protected according to the current.

Figure 4:
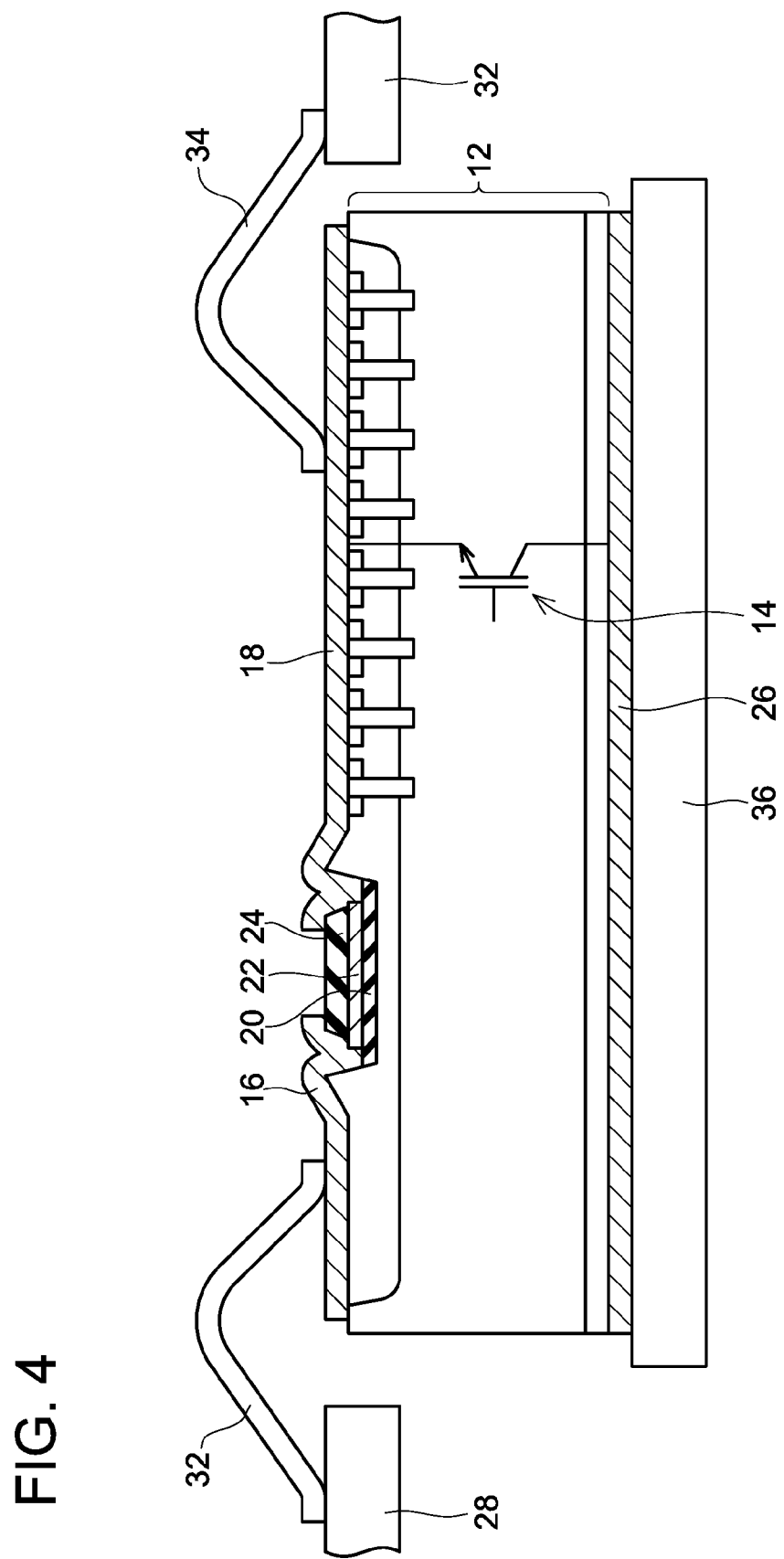
FIG. 4 is a vertical cross sectional view of a current breaker of a first variant.
Figure 5:
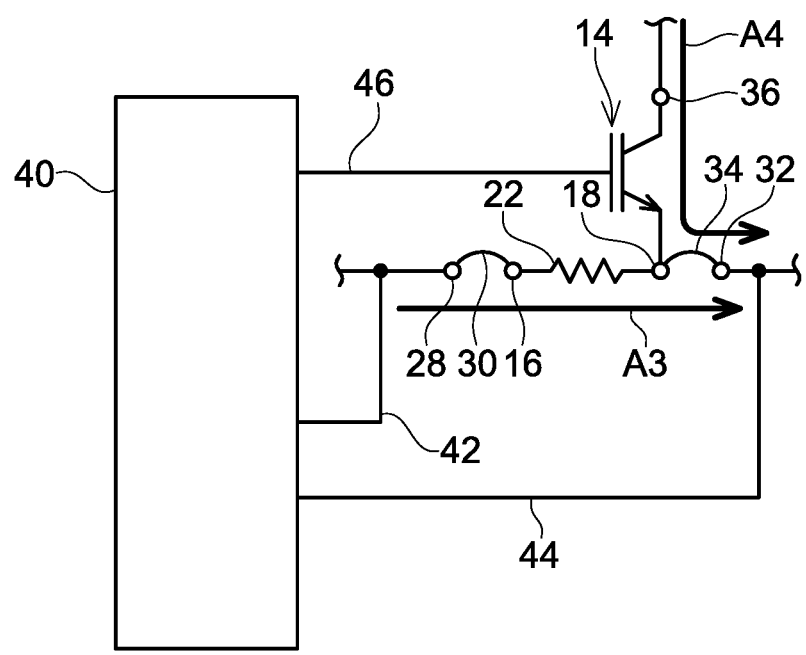
FIG. 5 is a circuit diagram of the current breaker of the first variant.
Figure 6:
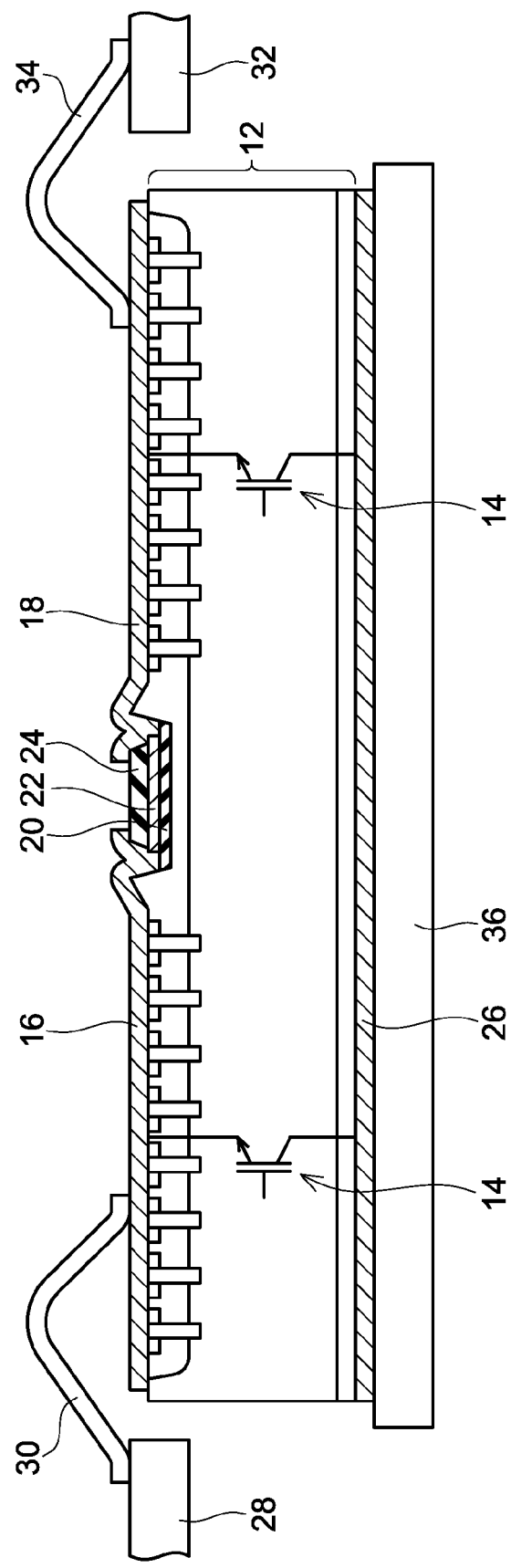
FIG. 6 is a vertical cross sectional view of a current breaker of a second variant.

Further, in the aforementioned embodiment, the IGBT 14 is connected to the electrode 16. However, as shown in FIG. 4, the IGBT 14 may be provided in the semiconductor substrate 12 such that the IGBT 14 is connected to the electrode 18. In this case, a configuration of the circuit diagram of the current breaker 10 is a configuration shown in FIG. 5. In this case as well, the current flowing through the IGBT 94 of the DC-DC converter flows through the resistive film 22 as shown by an arrow A3 of FIG. 5. Thus, the voltage of the current path including the resistive film 22 allows accurate measurement of the current flowing through the IGBT 94. Further, when the IGBT 14 turns on, the current flows as shown by an arrow A4 of FIG. 5. Due to this, the IGBT 14 is thermally destructed, and the BW 34 can be broken. Accordingly, the DC-DC converter circuit 60 can appropriately be protected. Further, as shown in FIG. 6, an IGBT 14 connected to the electrode 16 and an IGBT 14 connected to the electrode 18 may be provided in the semiconductor substrate 12. With this configuration as well, the DC-DC converter circuit 60 can appropriately be protected.

Figure 7:
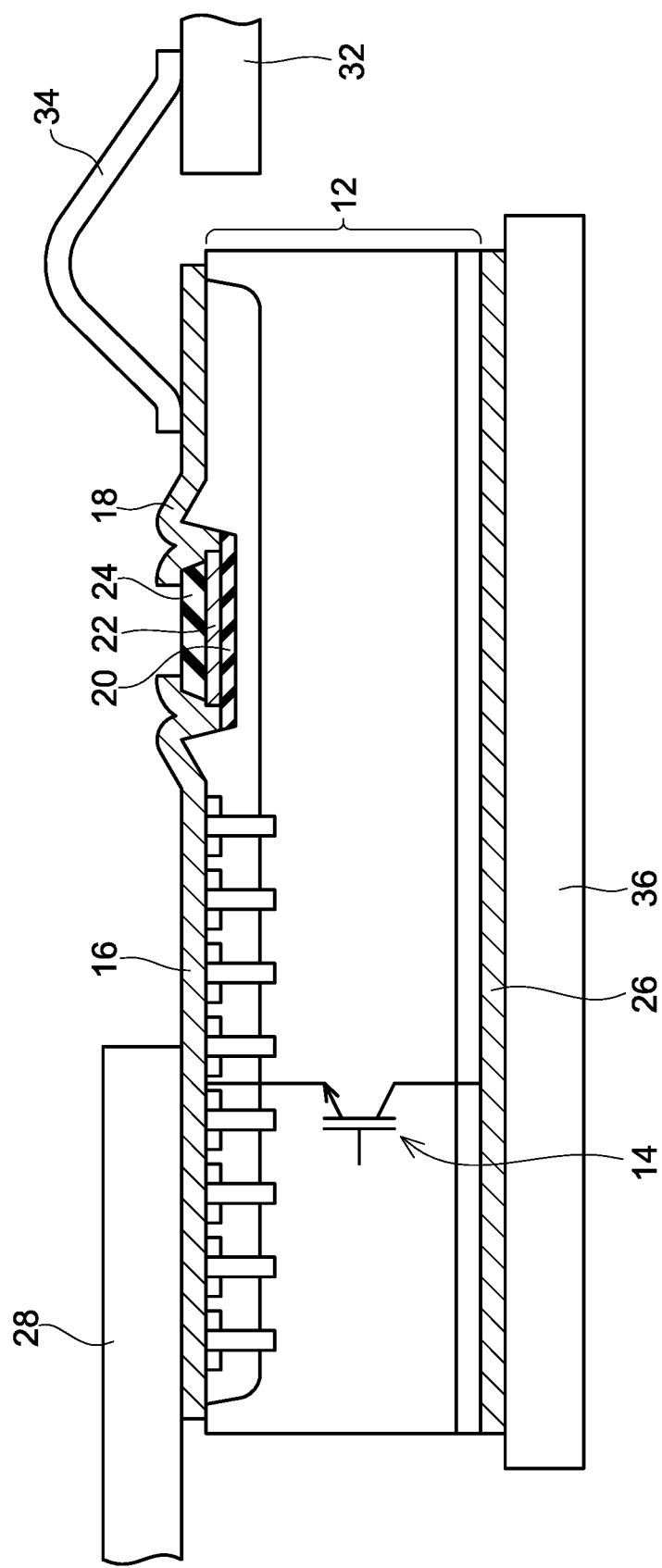
FIG. 7 is a vertical cross sectional view of a current breaker of a third variant.

Further, in the aforementioned embodiment, the bus bar 28 is connected to the electrode 16 by the BW 30. However, as shown in FIG. 7, the bus bar 28 may be bonded to the electrode 16 by solder or the like. That is, a connection structure between the bus bar 28 and the electrode 16 is not limited to wire bonding, and other various types of connection structures may be employed.

Further, in the aforementioned embodiment, a configuration which interrupts the current when the overcurrent flows through the IGBT 94 located at a lower arm of the DC-DC converter circuit 60 is described. However, the current breaker disclosed herein may be used for protection of various other elements. For example, the current breaker may be used to interrupt an overcurrent in the IGBT 90 located at an upper arm of the DC-DC converter circuit 60. Further, the current breaker may be used for protection of other circuits or elements. The current breaker can protect its protection target so long as a current flowing through the protection target element or circuit can flow through the resistive film 22 and the BW 34, the bus bar 28 comes to have a higher potential than the bus bar 32 upon when the resistive film 22 and the BW 34 are electrically conducted, and the bus bar 36 is connected to a potential higher than that for the bus bar 32.

Further, in the aforementioned embodiment, the IGBT 14 is provided in the semiconductor substrate 12. However, a switching element to be provided in the semiconductor substrate 12 may be other switching elements, such as a MOSFET and the like.

Figure 8:
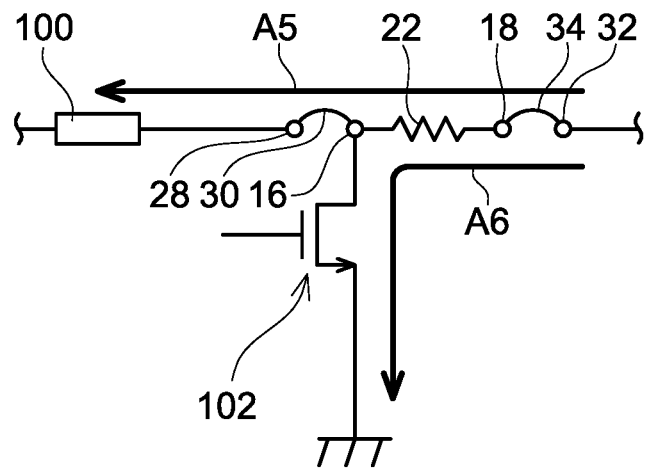
FIG. 8 is a circuit diagram of a current breaker of a fourth variant.

Further, the current breaker 10 in the aforementioned embodiment is configured as shown in FIG. 2 such that the current flows from the resistive film 22 toward the BW 34 that functions as the fuse. However, in a case where the switching element is configured of a MOSFET and the like, and the current can be flown toward a lower surface side from an upper surface side of the semiconductor substrate 12, the direction of the current may be opposite to that in the embodiment. For example, the current breaker 10 may be configured as in a circuit exemplified in FIG. 8. In the circuit of FIG. 8, a MOSFET 102 is provided instead of the IGBT 14. In the circuit of FIG. 8, the current flows from the BW 34 toward a protection target element 100 as shown by an arrow A5 during its normal operation. When the current flowing as shown by the arrow A5 rises to a threshold or higher, the MOSFET 102 turns on. When this happens, the current flows through the BW 34 and the MOSFET 102 as shown by an arrow A6. Due to this, the MOSFET 102 is thermally destructed, and the BW 34 is broken. According to this configuration as well, the protection target element 100 can be protected.

Further, in the aforementioned examples, the thermal destruction of the switching element occurs when the switching element such as the IGBT, the MOSFET, and the like turns on, and resulting in the breakage of the BW 34 by the impact upon the thermal destruction. However, the BW 34 may be fused and cut by the current flowing through the BW 34 when the switching element turns on.

Specific examples of the present invention have been described in detail, however, these are mere exemplary indications and thus do not limit the scope of the claims The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A current breaker, comprising:
a semiconductor substrate in which a switching element is provided;
a first electrode provided on a surface of the semiconductor substrate;
a second electrode provided on the surface and separated from the first electrode;
a resistive film provided on the surface and connecting the first electrode and the second electrode;
a terminal;
a bonding wire connecting the first electrode and the terminal and configured to break when the switching element is turned on; and
a control element configured to turn on the switching element when a voltage between both ends of a current path including the resistive film exceeds a threshold value,
wherein the switching element is connected to at least one of the first electrode and the second electrode.

2. The current breaker of claim 1, wherein the control element comprises a fuse configured to be disconnected when a current flowing through the control element exceeds a predetermined value.

3. The current breaker of claim 1, further comprising:
a high potential wiring;
a low potential wiring having a lower potential than the high potential wiring; and
a protection target element,
wherein
the switching element is connected between the high potential wiring and the first electrode or between the high potential wiring and the second electrode,
the protection target element is connected between the high potential wiring and the second electrode, and
the terminal is connected to the low potential wiring.

4. The current breaker of claim 3, wherein a gate of the protection target element is connected to a gate control circuit different from a gate control circuit connected to the control element.

* * * * *